(12) United States Patent
Mabuchi et al.

(10) Patent No.: US 11,095,842 B2
(45) Date of Patent: Aug. 17, 2021

(54) IMAGE SENSOR WITH ELECTRONIC GLOBAL SHUTTER AND DIFFERENTIAL SENSING USING RESET-SAMPLING CAPACITOR SHARED AMONG MULTIPLE IMAGE STORAGE CAPACITORS

(71) Applicant: OmniVision Technologies, Inc., Santa Clara, CA (US)

(72) Inventors: Keiji Mabuchi, Los Altos, CA (US); Sohei Manabe, San Jose, CA (US); Lindsay Grant, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 102 days.

(21) Appl. No.: 16/523,850

(22) Filed: Jul. 26, 2019

(65) Prior Publication Data
US 2021/0029322 A1    Jan. 28, 2021

(51) Int. Cl.
*H04N 5/3745* (2011.01)
*H01L 27/146* (2006.01)
*H04N 5/378* (2011.01)
*H04N 5/357* (2011.01)

(52) U.S. Cl.
CPC ... *H04N 5/37457* (2013.01); *H01L 27/14643* (2013.01); *H04N 5/3575* (2013.01); *H04N 5/378* (2013.01); *H04N 5/37452* (2013.01); *H04N 5/37455* (2013.01)

(58) Field of Classification Search
CPC ........... H04N 5/37457; H04N 5/37455; H04N 5/3742; H04N 5/378; H04N 5/37452; H04N 5/3575; H04N 5/3559; H01L 27/14643; H01L 27/14612
See application file for complete search history.

(56) References Cited

U.S. PATENT DOCUMENTS

| | | | |
|---|---|---|---|
| 6,710,804 B1* | 3/2004 | Guidash | H01L 27/14621 348/302 |
| 8,009,211 B2* | 8/2011 | Hashimoto | H04N 9/04557 348/294 |
| 2005/0146617 A1* | 7/2005 | Hashimoto | H04N 5/363 348/207.99 |
| 2005/0218299 A1* | 10/2005 | Olsen | H03F 3/087 250/214 A |

(Continued)

OTHER PUBLICATIONS

Kondo, T. et al., A 3D Stacked 16Mpixel Global-shutter CMOS Image Sensor Using 4 Million Interconnections, ITE Trans. on MTA vol. 4, No. 2, pp. 129-135 (2016).

*Primary Examiner* — Jennifer D Bennett
(74) *Attorney, Agent, or Firm* — Lathrop GPM LLP (57) ABSTRACT

An image sensor has an array of pixel blocks, and each pixel block having associated shutter transistors with each coupled to transfer an image signal comprising a charge dependent on light exposure of a selected pixel onto an image storage capacitor of a plurality of image storage capacitors associated with the pixel block, the image storage capacitors of the pixel block configured to be read through a differential amplifier into an analog to digital converter. The differential amplifier of each pixel block receives a second input from a single reset-sampling capacitor associated with the pixel block. The single reset-sampling capacitor is loaded when the pixels of the pixel block are reset.

18 Claims, 6 Drawing Sheets

(56) References Cited

U.S. PATENT DOCUMENTS

2006/0050163 A1\* 3/2006 Wang .................... H04N 3/155
348/308
2009/0091648 A1\* 4/2009 Lin ........................ H04N 5/357
348/301

\* cited by examiner

IMAGE SENSOR WITH ELECTRONIC GLOBAL SHUTTER AND DIFFERENTIAL SENSING USING RESET-SAMPLING CAPACITOR SHARED AMONG MULTIPLE IMAGE STORAGE CAPACITORS

BACKGROUND

Image sensors having global electronic shutters are useful for high speed photography. These image sensors may copy charge from many pixels simultaneously (or nearly simultaneously) into image storage capacitors, then read these image storage capacitors to image processing circuitry sequentially. By using a full-frame reset ending at the start of a shutter interval, followed by copying charge from pixels of an entire image into image storage capacitors at the end of the shutter interval, an image is captured undistorted by movement of a subject as the shutter interval begins and ends.

In some cameras, a high-speed burst of resets, followed by a high-speed burst of reads performed at the end of a shutter interval, can provide images with little if any distortion due to movement as the shutter interval ends.

A prior art pixel 100 (FIG. 1) for an image sensor has a photodiode 102 coupled through a first selection transistor 104 controlled by a photodiode selection line 106 to a first pixel node 108. First pixel node 108 couples through a first reset transistor 110 to an analog power 111. The first reset transistor 110 is controlled by a first reset control line 112 and selectively resets the photodiode 102. The first pixel node 108 also controls a first source-follower transistor 114. The first source-follower transistor 114 is coupled in series with a second selection transistor 116 to a loaded node 118 and a first terminal of a first, or coupling, capacitor 120. The loaded node 118 also couples to a load transistor 122 operated as a current source with grounded source and a current-mirror control voltage 124 on its gate.

Figure 1:
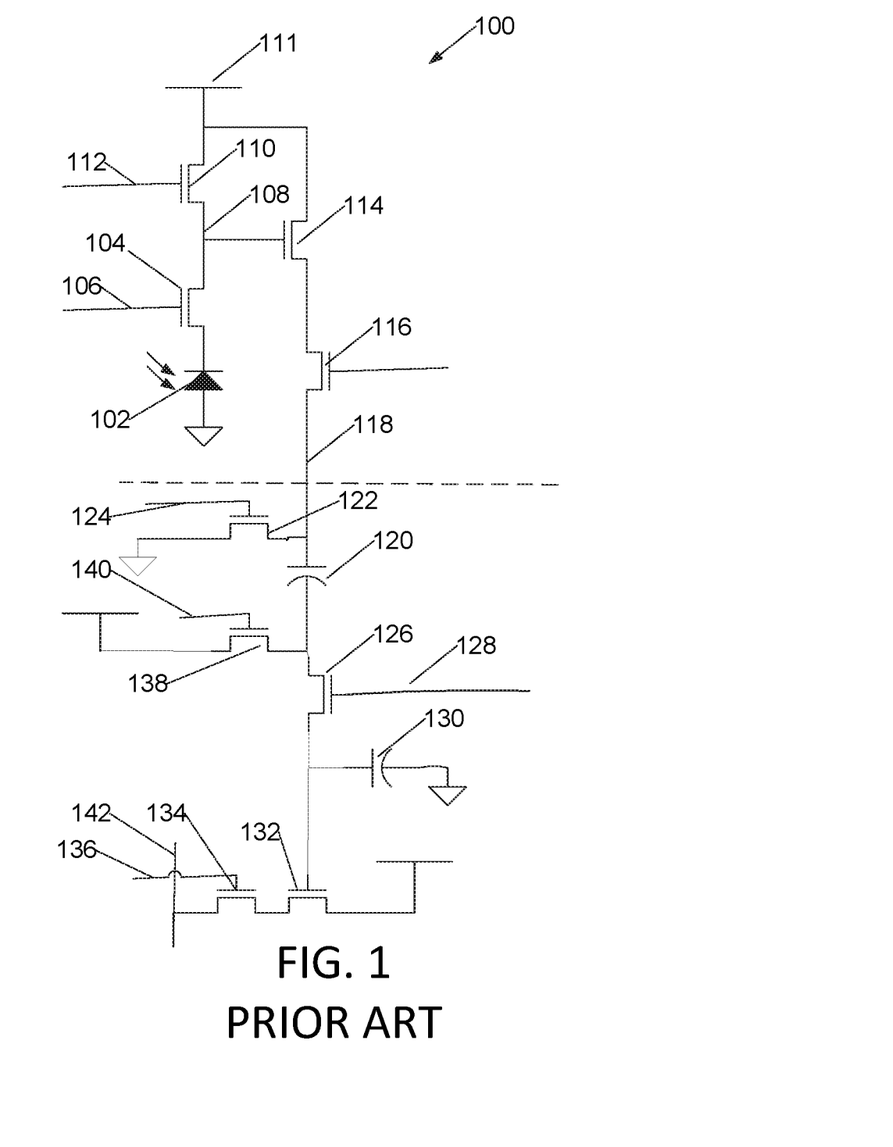
FIG. 1 is a simplified schematic diagram of a pixel and associated circuitry of a PRIOR ART image sensor.

First, or coupling, capacitor 120, which serves as a coupling capacitor, has a second terminal coupled through a shutter transistor 126 to a first terminal of an image storage capacitor 130. The shutter transistor 126 is controlled by a shutter line 128. The first terminal of the image storage capacitor 130 also controls a second source-follower transistor 132. A second reset transistor 138, controlled by a second reset control line 140, also couples to the second terminal of first, or coupling, capacitor 120. The second source-follower transistor 132 is in series with a third selection transistor 134 controlled by a data selection line 136. The third selection transistor 134 is coupled to drive a data line 142 that in turn couples through additional circuitry to an analog-to-digital converter (not shown) and thence to an image processor for further image processing. All devices in the pixel 100 shown in FIG. 1 are N-channel transistors.

For some pixels, charge may be stored on the image storage capacitor 130 for most of a frame time, in embodiments a frame time may be 16.6 milliseconds for a 60 frame per second video rate or 33 milliseconds for a 30 frame per second video rate, while other pixels may need to store charge for far shorter times.

Practical switching transistors, such as shutter transistors 126, associated with the image storage capacitors 130 leak, particularly in the contact diffusion area therebetween, which generates leakage current that causes dark current and white pixel issues. As leakage in shutter transistors 126 typically shifts voltage on the image storage capacitors 130 from a voltage associated with full black towards a voltage associated with light having been detected by the associated photodiodes 102.

Correlated double sampling (CDS) is employed in image sensors to reduce temporal noise, such as fixed pattern noise, by subtracting a dark or reference out level of a pixel from the actual light-induced signal. CDS operation requires two read-outs per pixel: a dark current or reference level read out and a light-induced signal read-out at the floating diffusion region of the pixel. Traditionally, at least two capacitors are included for each individual pixel circuit including one reset capacitor for temporarily storing the dark current or reference level signal and one image storage capacitor for storing the light-induced signal to permit subsequent differential operation to remove the unwanted noise.

SUMMARY

An image sensor has an array of pixels, each pixel having a plurality of associated shutter transistor coupled to transfer a charge dependent on light exposure of the pixel onto selected image storage capacitors of a plurality of image storage capacitors associated with the pixel. The image sensor also has a reset capacitor associated with each pixel, the reset transistor configured to sample a signal corresponding to no light exposure of the pixel. The image sensor includes a sample readout circuit configured to output the plurality of image signals stored in the plurality image storage capacitors with a reset signal from a reset-sampling capacitor common to the plurality of image signals. There are fewer reset-sampling capacitors than image storage capacitors in the image sensor. In an embodiment, the image storage capacitors are configured to be read into an analog to digital converter.

In one embodiment, the shutter transistors are P-type transistors in N-wells held at an analog power voltage to reduce sensitivity of pixels to dark current.

In one embodiment, the array of pixels include at least one pixel that includes a photodiode and a photodiode selection transistor. The photodiode selection transistor is configured to couple the photodiode to a first shutter transistor of the shutter transistors to transfer a first image signal onto a first image storage capacitor of the image storage capacitors when a gate of the photodiode selection transistor is biased at a first selection voltage. The photodiode selection transistor is configured to further couple the photodiode to a second shutter transistor of the shutter transistors to transfer a second image signal onto a second image storage capacitor of the image storage capacitors when the gate of the photodiode selection transistor is biased at a second selection voltage the first selection voltage is different from the second selection voltage.

In an embodiment, an image sensor has an array of pixel blocks, each pixel of the pixel block having an associated shutter transistor coupled to transfer a charge dependent on light exposure to the pixel onto an image storage capacitor associated with the pixel. A signal from the image storage capacitors of each pixel block is configured to be read through a differential amplifier into an analog to digital converter. A dark exposure level of the pixel corresponds to a voltage in the image storage capacitor near a voltage of a power supply coupled to the well in which the shutter transistor is formed, and a white exposure level of the pixel corresponds to a voltage in the image storage capacitor significantly different from the voltage of the power supply coupled to the well in which the shutter transistor is formed. Each differential amplifier is configured to compare a signal from a reset-sampling capacitor to the signal from the image storage capacitors, there being fewer reset-sampling capacitors than image storage capacitors.

In an embodiment, a method of capturing a digital electronic includes resetting a plurality of photodiodes, and exposing the photodiodes to an optical image; storing charge corresponding to a reset photodiode on a reset capacitor; reading the photodiodes and storing charge dependent on photodiode exposure onto a plurality of image storage capacitors, charge being stored onto each image storage capacitor through nodes having all directly connected source/drain diffusions P-type, and the charge dependent on photodiode exposure provides a higher voltage on the image storage capacitor for photodiodes exposed to dark portions of the optical image than for photodiodes exposed to light portions of the optical image; sensing difference in charge between the reset capacitor and the image storage capacitors with N-channel source followers and a differential amplifier coupled into an analog to digital converter; and converting the sensed charge into a digital image using the analog to digital converter.

BRIEF DESCRIPTION OF THE FIGURES

The present invention may be better understood, and its numerous objects, features and advantages made apparent to those skilled in the art by referencing the accompanying drawings. The use of the same reference number throughout the figures designates a like or similar element.

DETAILED DESCRIPTION OF THE EMBODIMENTS

In the following description, numerous specific details are set forth to provide a thorough understanding of the examples. One skilled in the relevant art will recognize that the techniques described herein can be practiced without one or more specific details, or with other methods, components, etc. In other instances, well-known structures, or operations are not shown or described in detail to avoid obscuring certain aspects of the examples.

Reference throughout this specification to "an example" or "an embodiment" means that a feature, structure, or characteristic described in connection with the example is included in at least one example of the present invention. Thus, the appearances of the phrases "in an example" or "in an embodiment" in various places throughout this specification are not necessarily all referring to the same example or embodiment. Furthermore, the features, structures, or characteristics may be combined in any suitable manner in one or more examples.

Terms such as "first", "second", and "third" are used in this specification to avoid confusion among components and do not limit the order or the like. Therefore, for example, the term "first" can be replaced with the term "second", "third", or the like as appropriate.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

Applicant believes pixel size reduction may be achieved by using common reset-sampling capacitors employed for shared pixel groups.

Figure 2A:
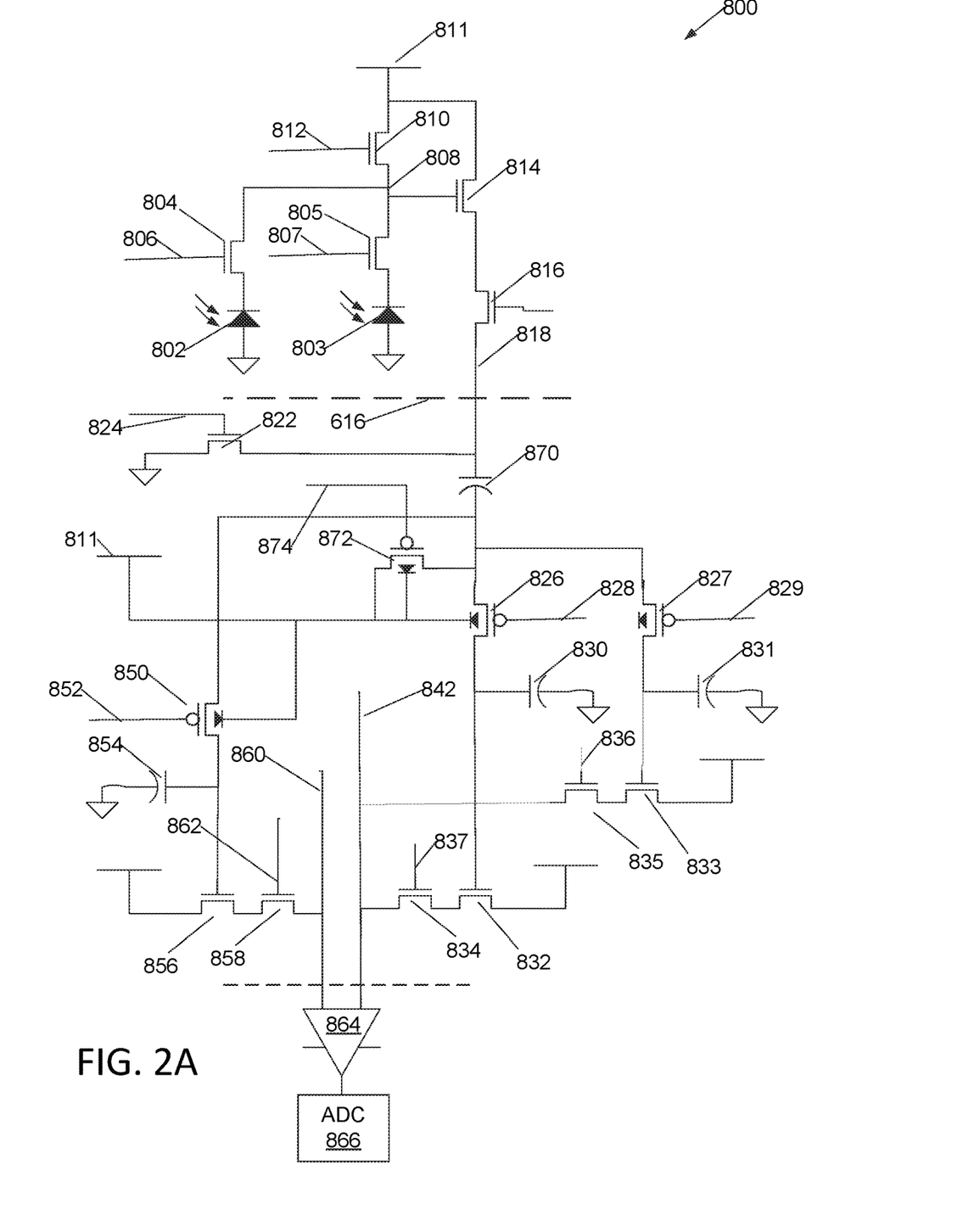
FIG. 2A is a schematic drawing illustrating an improved pixel circuit having a common reset capacitor.

Applicant also believes that much of the leakage current in transistors associated with image storage capacitors is associated with junction leakage of the diffused source and drain regions of the associated transistor; these transistors include reset-sampling transistor 850 and shutter transistor 826 (FIG. 2). The leakage at the source and drain regions is a function of voltage differences between the source and drain regions and the well and/or the substrate into which they are diffused. Thus, by having the reset-sampling transistor and the shutter transistor being P-type and located in an N-well clamped at an analog power e.g., analog power 811, leakage at high signal levels corresponding to low light reception or "dark" through the P-N source or drain diffusion attached to the first terminal of the image storage capacitor 830 or 831 is reduced over leakage encountered with similar signal levels in FIG. 1 where the shutter transistor 126 and other transistors including the reset transistors 110, 138, the selection transistors 104, 116, 134, and the source-follower transistors 114, 132 in the pixel 100 are all N-type transistors.

FIG. 2A shows a pixel block 800 in accordance to an embodiment for use in multiple-wafer image sensors. The pixel block 800 is adapted for differential sensing. Pixel group 800 may be employed in an array of pixels for a global shutter image sensor.

The improved pixel block 800 has photodiodes 802, 803 coupled through photodiode selection transistors 804, 805 to a first pixel node 808. The gate of photodiode selection transistors 804, 805 (or first selection transistors) are coupled to photodiode selection lines 806, 807 (or first selection lines). The photodiode selection transistors 804, 805 (or first selection transistors) are controlled by photodiode selection lines 806, 807 (or first selection lines). The first pixel node 808 couples through a block-level photodiode reset transistor 810 to an analog power 811. The photodiode reset transistor 810 (or first reset transistors) is controlled by a photodiode reset line 812 (or a first reset control line) to selectively reset photodiodes 802 803 to a predefined reset level such as a voltage level of analog power 811. The first pixel node 808 also controls a first source-follower transistor 814. The first source-follower transistor 814 is coupled in series through an optional second selection transistor 816 to a loaded node 818. The loaded node 818 also couples through a die to die bond to a load transistor 822, which operates as a current source with grounded source and a current-mirror control voltage 824 received on its gate.

The loaded node 818 further couples to a capacitive coupling and clamping circuit including a coupling capacitor 870 and a second reset transistor 872. The loaded node 818 couples to a first terminal of the coupling capacitor 870. A second terminal of the coupling capacitor 870 couples to a second reset transistor 872. The second reset transistor 872 also couples to the analog power 811.

Pixel block 800 also includes a sample readout circuit that is configured to operatively sample, hold, and output the image data signals corresponding to the charges generated by photodiodes 802, 803, and a reset signal for sampling a photodiode reset level, adapted for correlated double sampling processing of sampled images. The sample and hold circuit includes a reset-sampling transistor 850, a reset-sampling capacitor 854, a reset source-follower 856, a reset selection transistor 858, shutter transistors 826, 827, image storage capacitors 830, 831 corresponding to photodiodes 802 803, second source-follower transistors 832, 833, and third selection transistors 834, 835.

The second terminal of the first coupling capacitor 870 and the second reset transistor 872 also couple to the reset-sampling transistor 850 and the shutter transistors 826, 827 of the sample and hold circuit. The second reset transistor 872 is controlled by a second reset control line 874 and resets the coupling capacitor 870.

Reset-sampling transistor 850 of the sample and hold circuit is controlled by a reset-sampling line 852 and selectively passes charges onto reset-sampling capacitor 854 upon receiving a reset-sampling signal on the reset-sampling line 852. This reset-sampling capacitor holds a reset signal representing a photodiode reset level that is common for photodiodes 802, 803. Alternatively, the reset signal may be a sampled signal corresponding to no light exposure of the pixel. Photodiodes 802, 803 of the photodiodes 802, 803 share the same reset-sampling capacitor 854, therefore using the same reset signal in subsequent correlated double sampling processing for noise reduction The loaded node 818 also couples through shutter transistors 826, 827 to a first terminal of image storage capacitors 830, 831. In the embodiment of FIG. 2A, there are as many paired image storage capacitors 830, 831 and shutter transistors 826, 827 as there are photodiode and photodiode selection transistors 804, 805 in the pixel block 800. The number of image storage capacitors included in the pixel block 800 corresponds to the number of photodiodes included in the pixel block. There are fewer reset-sampling capacitors than image storage capacitors in the pixel block, for example in an embodiment the reset-sampling capacitor 854 is configured to be common to all the image storage capacitors within the pixel block 800. Shutter transistors 826, 827 are controlled by shutter lines 828, 829. A second terminal of each image storage capacitor 830, 831 is grounded. The shutter transistors 826, 827 are P-channel transistors formed in an N-well coupled to the analog power 811.

The first terminal of the image storage capacitor 830 controls a second source-follower transistor 832, and the image storage capacitor 831 controls a second source-follower transistor 833. The second source-follower transistors 832, 833 are coupled in series with third selection transistors 834, 835, respectively. The third selection transistors 834, 835 is controlled by third selection lines 836, 837, only one of the third selection lines is active at any one time. The third selection transistors 834, 835 are coupled to drive data lines 842, respectively that in turn couples through additional circuitry, including for example a differential amplifier 864, to an analog-to-digital converter (ADC) 848.

Because in this embodiment, the shutter transistors 826, 827 are P-type and located in an N-well tied to the analog power 811, leakage at high signal levels corresponding to low light reception or "dark" through the P-N source or drain diffusion attached to the first terminal of the image storage capacitor 830 is reduced over leakage encountered with similar signal levels in FIG. 1 where the shutter transistor 126 and other transistors including the reset transistor, selection transistors, and source-follower transistor in the pixel are N-type transistors in grounded well or substrate.

The reset-sampling transistor 850, having a gate controlled by the reset-sampling line 852, to sample a reset, or fully-dark level, on a first terminal of the reset-sampling capacitor 854. A second terminal of the reset-sampling capacitor 854 is grounded. Voltage on the reset-sampling capacitor 854 is configured to control a gate of a reset source-follower 856. The reset source-follower 856 is coupled in series with a reset selection transistor 858. The reset selection transistor 858 is controlled by a pixel block read select line 862 that is active whenever any of the pixel blocks read selection lines 834, 835 are active. This configuration reads the reset-sampling capacitor 854 through the reset source-follower 856 and the reset selection transistor 858 to a reset sense line 860 simultaneously with one of the image storage capacitors 830, 831 being read through the second source-followers 832, 833 and third selection transistor 834, 835 onto the data line 842, and thus to the externally connected differential amplifier 864 and analog-to-digital converter 866.

In this embodiment, the reset sense line 860 and the data line 842 are sensed by the differential amplifier 864 to reduce noise and improve dark levels over single-ended sensing systems, in other embodiments, the reset sense line 860 and the data line 842 are sensed by other methods, such as a fully differential analog-to-digital converter.

During a precharge period, the photodiode reset line 812 is held high with photodiode reset signal RST while the photodiode selection lines, such as photodiode selection lines 806 and 807, are pulsed one at a time with photodiode selection signals, such as TX1, TX2 to reset the photodiodes 802, 803 to the predefined reset level. For example, the photodiode selection line 806 is pulsed simultaneously with photodiode reset line 812 to reset the photodiode 802, while subsequent photodiode 803 is reset in rapid sequence thereafter by additional photodiode selection lines such as photodiode selection line 807. A falling edge of each photodiode selection signal TX1, TX2, begins an exposure period (also referred to as a global shutter interval) for the associated pixels.

The photodiodes 802, 803 are exposed to light during the exposure period (or global shutter interval), the length of the exposure period (or global shutter interval) is chosen depending on overall brightness of the optical image provided to pixels of the pixel array.

Figure 2B:
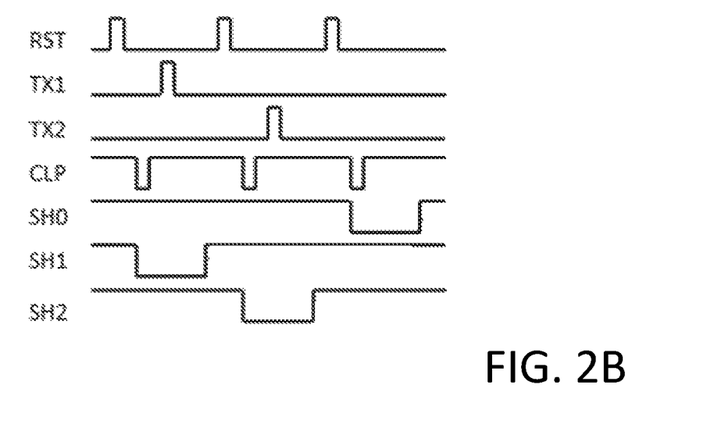
FIG. 2B is a simplified timing diagram illustrating global charge transfer in an exemplary pixel circuit.
Figure 2C:
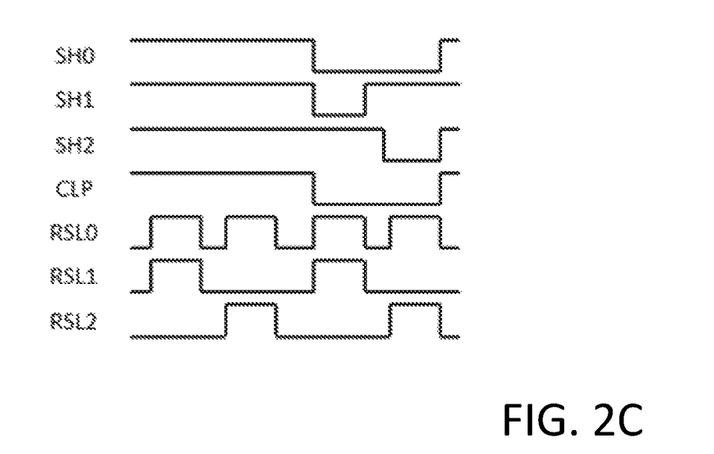
FIG. 2C is a simplified timing diagram illustrating read out operation in an exemplary pixel circuit.

Please refer to FIG. 2B and FIG. 2C in conjunction with FIG. 2A. FIG. 2B illustrates an exemplary timing operation for global charge transfer associated with pixel block 800 in an embodiment. FIG. 2C illustrates an exemplary timing operation for row by row read out associated with pixel block 800 in the embodiment.

During a global charge transfer period subsequent to the global shutter operation, the charges (or a first image data signal) generated by the photodiode 802 in response to incident light is transferred and stored into the image storage capacitor 830 through the coupling capacitor 870, and the charges (or a second image data signal) generated by the photodiode 803 in response to the incident light is stored into the image storage capacitor 831 through the coupling capacitor 870.

The brighter illumination of the pixel, the greater the signal level, the lower the sampled voltage level is on the image storage capacitors 830, 831 from the analog power 811. After transferring the charges from the photodiode 802, 803 to the image storage capacitors 831, the reset-sampling transistor 850 is turned on to reset the reset-sampling capacitor 854 to a reset level, in an embodiment to the analog power 811.

For example, as shown in FIG. 2B, the photodiode reset line 812 are held low with photodiode reset signal RST and the second reset control line 874, CLP is pulsed low while the photodiode selection line 806 is pulsed high with the photodiode selection signal TX1 to read accumulated light depend charges (or the first image data signal) from photodiode 802 to the first terminal of the first coupling capacitor 870. The shutter line 828 is pulsed low with shutter signal SH1 while the shutter line 829 remains high with shutter signal SH2, to place the charges (or the first image data signal) onto the image storage capacitors 830.

The sequence of photodiode reset line 812 pulsing high with second reset control line 874 pulsing low and the photodiode selection line 807 pulsing high to capture signal on the image storage capacitor 831 with the shutter line 829, SH2 pulsed low, is repeated for each additional photodiode circuit included in the pixel block and associated image storage capacitor.

After the charge transfer sequence, the photodiode reset line 812 is pulsing high. The second reset control line 874, CLP is subsequently pulsed low while the reset-sampling line 852 pulsed low by the reset-sampling signal SH0 and shutter lines 829, 829 remain high place the charges corresponding to the reset signal onto the first terminal of the reset-sampling capacitor 854.

During the read-out period, the first image data signal and the reset signal stored at the image storage capacitor 830 and the reset-sampling capacitor 854 are read out through the reset sense line 860 and the data line 842, respectively by holding sampling control signal RSL1 high and pulsing the shutter lines 828 while holding the second reset control line low with the second reset control signal CLP. Similarly, the second image data signal and the same reset signal stored at the image storage capacitor 831 and the reset-sampling capacitor 854, respectively, are read out through the reset sense line 860 and the data line 842 by holding sampling control signal RSL2 high and pulsing the shutter lines 828 while holding the second reset control line CLP low. During the read out period, the pixel block read select line 862 is pulsed with a reset-sampling control signal RSL 0, and the image storage capacitor 830 and the reset-sampling capacitor 854 are read out at each rising edge of the reset-sampling control signal RSL 0. The sampled reset signal level may correspond to a predefined reset level that the photodiodes 802, 803 initially reset to during the precharge period.

Next, the reset sense line 860 and the data line 842 are configured to be connected to output both a first differential signal, which is the difference of the first image data signal and the sampled reset signal, and a second differential signal, which is the difference of the second image data signal and the sampled reset signal. The first differential signal, the first image data signal, and the sampled reset signal are subsequently processed to construct a first image signal representing the charges generated by the photodiode 802. The second differential signal, the second image data signal, and the reset signal are subsequently processed to construct a second image signal representing the charges generated by the photodiode 803.

In an embodiment, a pixel block may include four photodiodes, where a single reset-sampling capacitor can be used to provide a common reset signal to the four photodiodes. In this embodiment, four image storage capacitors 830, 831 and one reset-sampling capacitor 854 are needed.

Figure 3:
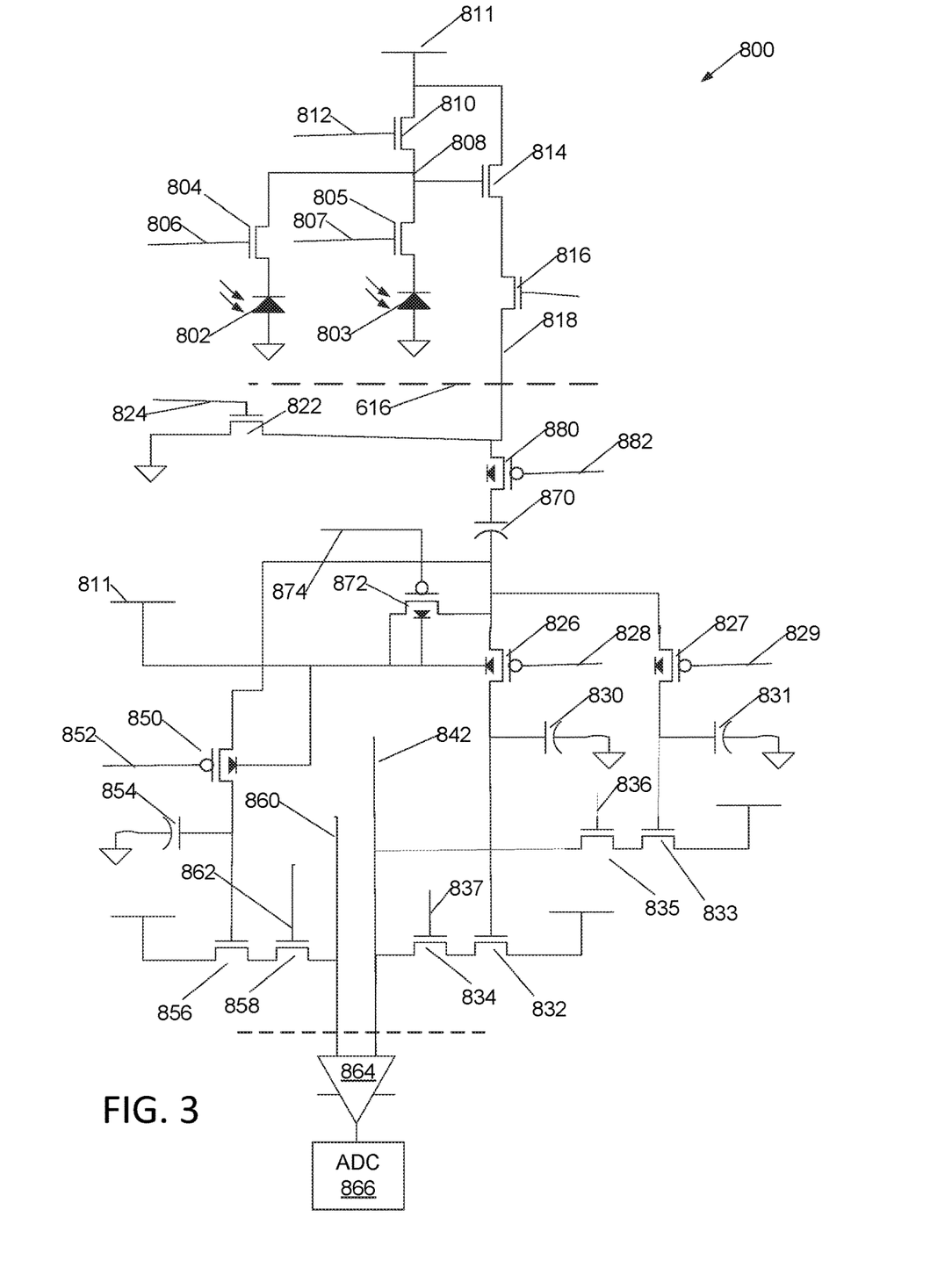
FIG. 3 is a schematic drawing illustrating another improved pixel circuit having a common reset capacitor.

In an embodiment illustrated in FIG. 3, a signal cutoff transistor 880 having a gate controlled by a signal-cutoff control line 882 is inserted between the second selection transistor 816 and the first terminal of the coupling capacitor 870. The signal cutoff transistor 880 is configured to selectively cut off the electrical connection (e.g., signal transmission path or charge transfer path) between the first terminal of the coupling capacitor 870 and the first terminal of the image storage capacitor 830 or 831 of the pixel 800 upon receiving a cutoff signal. In this embodiment, the momentary high voltages on the image storage capacitor 830 or 831, typically occurring before signals are valid at the image storage capacitor 830 or 831, are blocked from reaching the image storage capacitor 830 or 831. The image storage capacitor 830 or 831 in the instant embodiment lacks such transients and has better dark levels than those stored on the image storage capacitor 130 in prior pixels 100 (FIG. 1).

Figure 4:
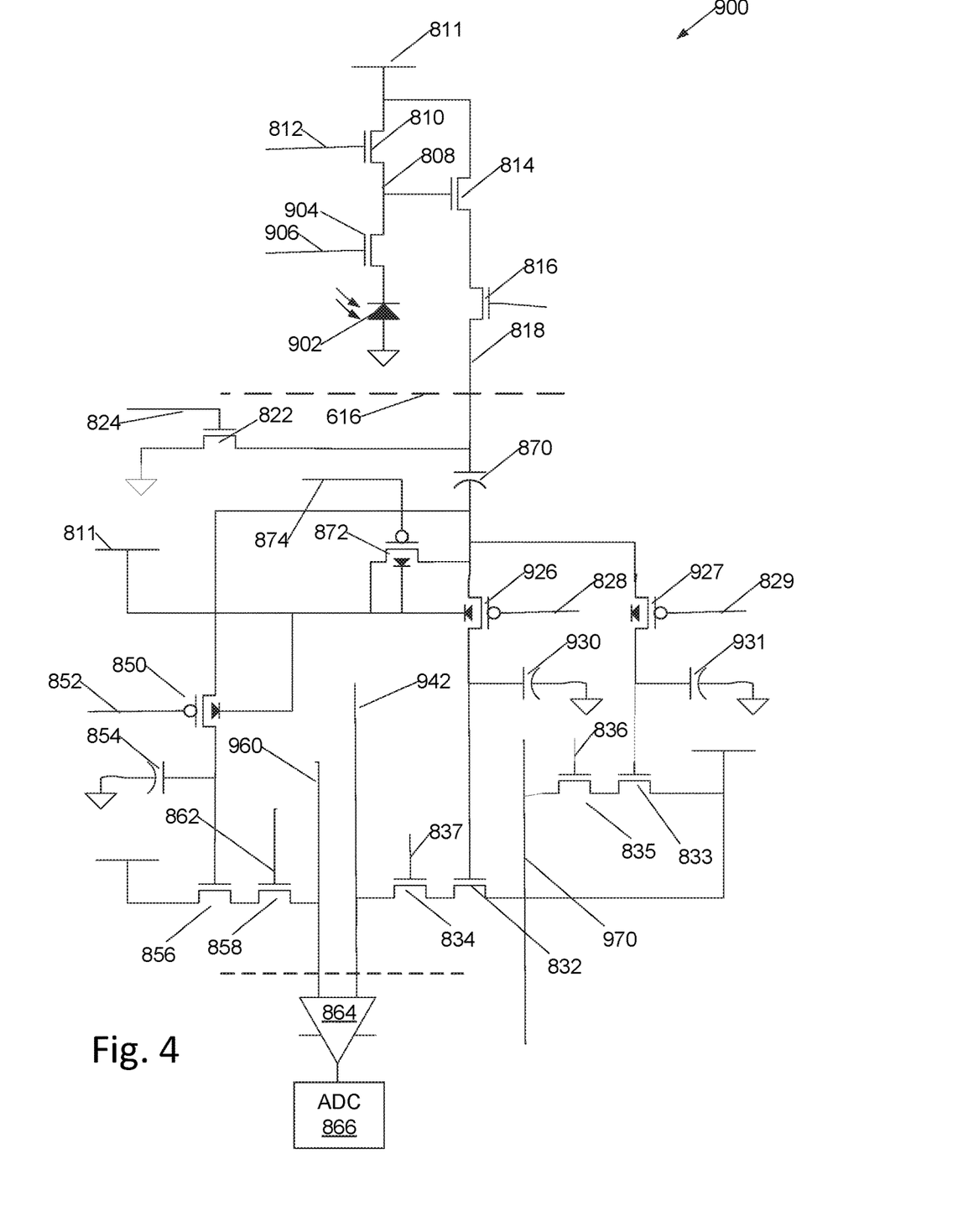
FIG. 4 is a schematic drawing of an improved pixel circuit having multiple image sampling capacitors for each pixel to enhance dynamic range.

In another embodiment, as illustrated in FIG. 4, the pixel circuit 900 has a fewer photodiodes, such as photodiode 902, than the number of image storage capacitors used. The pixel circuit 900 may be used in an array of pixel for a global shutter image sensor. The photodiode selection transistors 904 for the photodiodes 902 in a multi-level selection for multiple readout embodiment are configured to receive different level of selection voltages on photodiode selection lines 906. For example, the photodiode selection transistors 904 (first selection transistor) are first selected by a mid-level selection voltage of a biasing voltage at the gate of photodiode selection transistors 904, such that the photodiode selection transistors 904 conduct only if photocurrent in the photodiode 902 has deeply discharged the photodiode a threshold voltage below the mid-level select voltage. This deep discharge voltage on the photodiode is read through image sampling transistor 926 (e.g., first image sampling transistor or first shutter transistor) and stored onto an image storage capacitor 930 as first sampled image data signal. The photodiode selection transistors 904 are then given a high level selection voltage, such that photodiode selection transistor 904 of dimly lit pixel conduct, the resulting lower-light data signal is read and stored through a different image sampling transistor 927 (e.g., second image sampling transistor or second shutter transistor) and stored onto another image storage capacitor 931 as second sampled image data signal. The image data signals stored in the image storage capacitors 930, 931 are read-out onto data lines 942, 970 along with the reset signal read-out from reset-sampling capacitor 854 on data line 960 whence additional circuitry differences and processes them to realize a wide dynamic range for the pixel circuit. The reset signal in this embodiment is common to both first and sampled image data signal for subsequent signal processing, such as correlated double sampling.

In an alternative embodiment, a circuit of FIG. 4 is operated at the end of a first portion of the global shutter interval with full selection voltages on photodiode selection lines 906 and photodiode selection transistor 904 to sample charge first through the first image sampling transistor 926 onto the first image storage capacitor 930; then photodiode selection lines 906 are raised again (or kept high through sampling at both image storage capacitors) at the end of a second portion of the global shutter interval on photodiode selection lines 906 to sample charge through second image sampling transistor 927 onto second image storage capacitor 931. The image data signals stored in the image storage capacitors 930, 931 are read-out onto data lines 942, 970 along with the reset signal stored in the reset-sampling capacitor 854, onto data line 960 whence additional circuitry differences and processes them to realize a wide dynamic range for the pixel circuit. In this mode, brightly illuminated pixels may be processed from the image storage capacitor 930 loaded at the end of the first portion of the global shutter interval, while dimly illuminated pixels are processed from the image storage capacitor 931 loaded at the end of the second portion of the global shutter interval. Capturing data with short and long exposure times in this way can permit processing images with a wide dynamic range of light intensity.

In the embodiments of FIGS. 2A, 3 and 4, the image storage capacitors e.g., image storage capacitors 830, 831, 930, 931 are configured such that the charge storage nodes have all attached source/drain diffusion regions of P-type and formed in a well or wells of N-type coupled to the analog power. With these embodiments, dark levels in the image storage capacitors are near voltage of the well in which the associated shutter transistors are formed.

It should be appreciated by people skilled in the art that a complementary version having P-type devices throughout except for N-type shutter transistors 828, 829 and reset-sampling transistor 850 in grounded P-well or P-wells can be constructed; this is not shown for simplicity.

Figure 5:
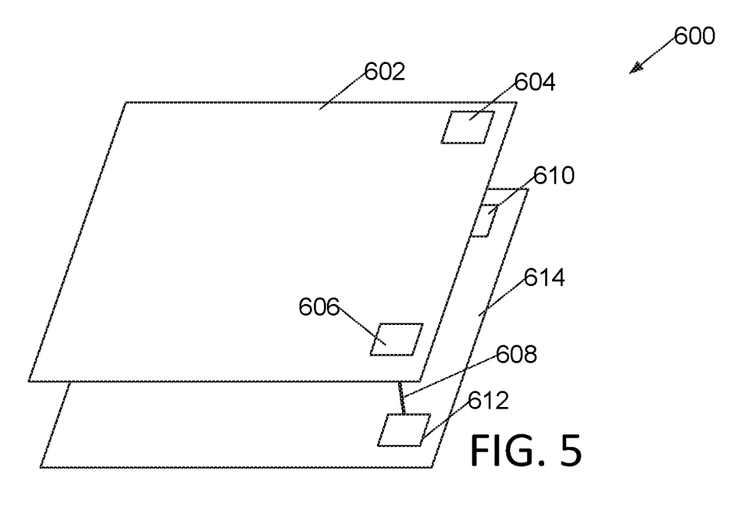
FIG. 5 is an illustration of a multiple-wafer image sensor having pixels realized as in FIGS. 2A, 3 and 4.

It is expected that the embodiments of FIG. 2A-4 may be implemented on a single-wafer, single-die, image sensor or on a multiple-wafer, multi-die, stacked image sensor, such as the two-die stacked embodiment 600 illustrated in FIG. 5 with reference to FIG. 2A. In this embodiment, photodiodes, such as photodiodes 802, 803, with associated photodiode selection transistors 804, 805 (first selection transistor) are implemented on a first (or pixel) die or wafer 620. In some embodiments, the photodiode reset transistors 812 (first reset transistor), source-follower transistors 814, and the second selection transistor 805 are implemented on a first (or pixel) die or wafer 602 in pixel block 604, 606. Each pixel block 604, 606 is electrically coupled by a die-to-die bond 608 to an associate storage capacitor group 610, 612 physically located on a second (or logic) die or wafer 614. This organization corresponds to locating components above a cut line 616 on the first (pixel) die 602 and components below cut line 616 on the second (or logic) die or wafer 614. The first (pixel) die 602 may be bonded to the second (or logic) die or wafer 614 through die to die or wafer-to-wafer bonding, such as hybrid bonding.

Combinations of Features

The features herein disclosed may be combined in various ways in embodiments. In particular, it is anticipated that the multiple-pixel replicated units illustrated with reference to FIG. 5 may be used with the embodiments otherwise disclosed and discussed with reference to FIG. 2, 3, or 4; and the signal cutoff transistor illustrated in FIG. 3 may be used with the embodiments otherwise discussed with reference to FIG. 4. Further, it is expected that any of the embodiments discussed with reference to FIGS. 2-4 may be implemented on a single-die image sensor, on a dual-die stacked multi-wafer image sensor as depicted in FIG. 5, or on an image sensor having additional stacked die such as a digital memory die or wafer.

In particular embodiments, combinations anticipated include:

An image sensor designated A has an array of pixels, each pixel having an associated shutter transistor coupled to transfer a charge dependent on light exposure to the pixel onto an image storage capacitor, the image storage capacitors being configured to be read into an analog to digital converter, where the shutter transistors are formed in wells coupled to a power supply, and where a dark exposure level of the pixel corresponds to a voltage in the image storage capacitor near a voltage of a power supply coupled to the well in which the shutter transistor is formed, and a white exposure level of the pixel corresponds to a voltage in the image storage capacitor significantly different from the power supply coupled to the well in which the shutter transistor is formed.

An image sensor designated AA1 including the image sensor designated A wherein the shutter transistors are P-channel transistors in N-type wells coupled to an analog power.

An image sensor designated AA2 including the image sensor designated A wherein the shutter transistors are N-channel transistors in P-type wells coupled to ground.

An image sensor designated AA3 including the image sensor designated A, AA1, or AA2, wherein the charge dependent on light exposure couples to the image storage capacitors through coupling capacitors.

An image sensor designated AA including the image sensor designated A, AA1, AA2, or AA3 wherein pixels of the pixel array are organized in pixel units including at least one photodiode and at least one selection transistor, the selection transistor coupling the photodiode to a first pixel node, the first pixel node coupled through a source follower and a first (or coupling) capacitor to the shutter transistor.

An image sensor designated AAA including the image sensor designated AA further including a signal cutoff transistor coupled between the selection transistor and the coupling capacitor.

An image sensor designated AAB including the image sensor designated A, AA, AAA, AA1, AA2, or AA3 where each pixel unit comprises a plurality of photodiodes coupled through selection transistors to the first pixel node.

An image sensor designated AAC including the image sensor designated A, AA, AAA, AAB, AA1, AA2, or AA3 where a second photodiode and selection transistor couple to a second pixel node, the second pixel node coupled through a source follower to the first (or coupling) capacitor.

An image sensor designated AB, including the image sensor designated A, AA, AAA, AAB, AAC, AA1, AA2, or AA3 further including a reset-sampling transistor configured to sample a charge dependent on a reset level on a reset-sampling capacitor, and where the image storage capacitors are coupled to be read into the analog to digital converter through a differential amplifier having an input coupled to the reset-sampling capacitor.

A method designated B of capturing a digital electronic image including resetting a plurality of photodiodes, and exposing the photodiodes to an optical image; reading the photodiodes and storing charge dependent on photodiode exposure onto a plurality of image storage capacitors; reading the photodiodes and storing charge dependent on photodiode exposure onto a plurality of image storage capacitors, charge being stored onto each image storage capacitor through nodes where all attached source/drain diffusion regions are P-type and formed in an N-type well coupled to an analog power, the charge dependent on photodiode exposure provides a higher voltage on the image storage capacitor for photodiodes exposed to dark portions of the optical image than for photodiodes exposed to light portions of the optical image; sensing charge in the image storage capacitors with N-channel source followers into an analog to digital converter; and using the analog to digital converter to convert the sensed charge into a digital image.

A method designated BA including the method designated B further comprising passing the charge dependent on photodiode exposure through coupling capacitors.

A method designated BB including the method designated B or BA further comprising latching a charge corresponding to a photodiode reset level in a reset capacitor, and wherein sensing charge in the image storage capacitors further comprises amplifying difference between a signal dependent on charge in the image storage capacitors and a signal dependent on charge in the reset capacitor.

An image sensor designated C has an array of pixel blocks, each pixel of the pixel block having an associated shutter transistor coupled to transfer a charge dependent on light exposure to the pixel onto an image storage capacitor associated with the pixel. A signal from the image storage capacitors of each pixel block is configured to be read through a differential amplifier into an analog to digital converter. The shutter transistors are formed in wells coupled to a power supply, where a dark exposure level of the pixel corresponds to a voltage in the image storage capacitor near a voltage of a power supply coupled to the well in which the shutter transistor is formed, and a white exposure level of the pixel corresponds to a voltage in the image storage capacitor significantly different from the voltage of the power supply coupled to the well in which the shutter transistor is formed. Each differential amplifier is configured to compare a signal from a reset-sampling capacitor to the signal from the image storage capacitors, there being fewer reset-sampling capacitors than image storage capacitors.

An image sensor designated CA including the image sensor designated C wherein the shutter transistors are P-channel transistors in N-type wells coupled to analog power.

An image sensor designated CB including the image sensor designated C wherein the shutter transistors are N-channel transistors in grounded P-type wells.

An image sensor designated CC including the image sensor designated C, CA, or CB wherein pixels of the pixel array are organized in pixel units comprising a photodiode and a selection transistor, the selection transistor coupling the photodiode to a first pixel node, the first pixel node coupled through a source follower and a coupling capacitor to the shutter transistor.

An image sensor designated CD including the image sensor designated C, CA, CB or CC wherein each pixel unit comprises a plurality of photodiodes coupled through selection transistors to the first pixel node.

An image sensor designated CE including the image sensor designated C, CA, CB, CC or CD wherein a second photodiode and selection transistor couple to a second pixel node, the second pixel node coupled through a source follower to the shutter transistors.

An image sensor designated CF including the image sensor designated C, CA, CB, CC, CD or CE further comprising signal cutoff transistors coupled between the selection transistors and the shutter transistor.

A method designated D of capturing a digital electronic including resetting a plurality of photodiodes, and exposing the photodiodes to an optical image; storing charge corresponding to a reset photodiode on a reset capacitor; reading the photodiodes and storing charge dependent on photodiode exposure onto a plurality of image storage capacitors, charge being stored onto each image storage capacitor through nodes having all directly connected source/drain diffusion regions of P-type formed in a well of N-type well coupled to an analog power, and the charge dependent on photodiode exposure provides a higher voltage on the image storage capacitor for photodiodes exposed to dark portions of the optical image than for photodiodes exposed to light portions of the optical image; sensing difference in charge between the reset capacitor and the image storage capacitors with N-channel source followers and a differential amplifier coupled into an analog to digital converter; and converting the sensed charge into a digital image using the analog to digital converter.

An image sensor designated E includes an array of pixel blocks including multiple pixels, each pixel of each pixel block having multiple associated shutter transistors each coupled to transfer an image signal comprising a charge dependent on light exposure to the pixel onto an image storage capacitor of a plurality of image storage capacitors associated with the pixel. Each pixel block including a sample readout circuit configured to output the plurality of image data signals stored in the plurality of image storage capacitors, and a reset signal stored in a reset-sampling capacitor. The reset signal corresponds to a reset level common to the plurality of image data signals, and there are fewer reset-sampling capacitors than image storage capacitors in each pixel block.

An image sensor designated EA including the image sensor designated E wherein the shutter transistors are P-channel transistors in N-type wells coupled to the analog power.

An image sensor designated EB including the image sensor designated E wherein the shutter transistors are N-channel transistors in grounded P-type wells.

An image sensor designated EC including the image sensor designated E, EA, or EB wherein pixels of the pixel array are organized in pixel units including a photodiode and a selection transistor, the selection transistor coupling the photodiode to a first pixel node, the first pixel node coupled through a first source-follower transistor and a coupling capacitor to the image signal.

An image sensor designated EE including the image sensor designated ED wherein each pixel unit includes a plurality of photodiodes coupled through selection transistors to the first pixel node.

An image sensor designated EF including the image sensor designated E, EA, EB, EC, ED, or EE further comprising a signal cutoff transistor coupled between the selection transistor and the shutter transistor.

An image sensor designated EG including the image sensor designated E, EA, EB, EC, ED, EE, or EF wherein pixels of the pixel array are organized in pixel units comprising a photodiode and a selection transistor, a selection transistor of the selection transistors coupling the photodiode to a first pixel node, the first pixel node coupled through a first source-follower transistor and a coupling capacitor to the shutter transistor.

An image sensor designated EH including the image sensor designated E, EA, EB, EC, ED, EE, EF, or EG wherein each pixel unit comprises a plurality of photodiodes coupled through selection transistors to the first pixel node.

An image sensor designated EJ including the image sensor designated E, EA, EB, EC, ED, EE, EF, EG, or EH wherein there are more image storage capacitors than photodiodes in each pixel block.

An image sensor designated EK including the image sensor designated E, EA, EB, EC, ED, EE, EF, EG, EH, or EJ wherein the signal from the image storage capacitors of each pixel block are configured to be read through a differential amplifier into an analog to digital converter, wherein the shutter transistors are formed in wells coupled to an analog power supply, and where a dark exposure level of the pixel corresponds to a voltage in the image storage capacitors near a voltage of the analog power supply, and a white exposure level of the pixel corresponds to a voltage in the image storage capacitors significantly different from the voltage of the power supply coupled to the well in which the shutter transistor is formed.

A method designated F of capturing a digital electronic image includes resetting a plurality of photodiodes, and exposing the photodiodes to an optical image; resetting the photodiodes and storing charge corresponding to a reset photodiode on a reset-sampling capacitor; reading the photodiodes and storing charge dependent on photodiode exposure onto a plurality of image storage capacitors; and determining a plurality of image signals from a reset signal read from the reset-sampling capacitor and a plurality of image data signals read from the image storage capacitors, wherein the reset signal corresponding to the charges stored on the reset-sampling capacitor and the image data signals corresponding to charges stored on the associated image storage capacitor.

A method designated FAA including the method designated F, wherein determining a plurality of image signals includes: reading each of the plurality of image data signals separately, wherein each of the plurality of image data signals is read along with the reset signal; and sensing difference between the reset signal and each of the plurality of image data signals to generate the plurality of image signals.

A method designated FAB including the method designated F or FAA wherein sensing difference in charge between the reset capacitor and the image storage capacitor is performed through source follower transistors and a differential amplifier coupled into an analog to digital converter.

A method designated FA including the method designated F, FAA, or FAB, further including: converting the sensed plurality of image signals into a digital image using an analog to digital converter.

A method designated FB including the method designated F, FAA, FAB, or FA, wherein the charges stored onto each image storage capacitor are stored through nodes having all directly connected transistors with source/drain diffusion regions of a first conductive type in wells of a second conductive type, and the charge dependent on photodiode exposure provides a voltage on the image storage capacitor closer to a well voltage associated with the directly connected transistors for photodiodes exposed to dark portions of the optical image than for photodiodes exposed to light portions of the optical image;

A method designated FC including the method designated FB, wherein the first conductive type is a P-type and the second conductive type is an N-type.

A method designated FD including the method designated FB, wherein the first conductive type is an N-type and the second conductive type is a P-type.

A method designated FE including the method designated F, FAA, FAB, FA, FB, FC, or FD, wherein there is a plurality of image storage capacitors associated with each photodiode, and wherein reading the photodiodes and storing charge dependent on photodiode exposure onto the image storage capacitors comprises applying a first selection voltage to a gate of a photodiode selection transistor, storing charge on a first of the image storage capacitors, applying a second selection voltage to the gate of the photodiode selection transistor different from the first selection voltage, and storing charge on a second of the image storage capacitors.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An image sensor comprising:
an array of pixel blocks including one or more photodiodes, a plurality of image storage capacitors and a reset-sampling capacitor, each photodiode coupled to at least one shutter transistor, the at least one shutter transistor coupled to transfer an image data signal comprising a charge dependent on light exposure to a photodiode of the pixel block onto an associated image storage capacitor of the plurality of image storage capacitors associated with the pixel block, each pixel block including a sample readout circuit, configured to output the plurality of image data signals stored in the plurality of image storage capacitors, and a reset signal stored in the reset-sampling capacitor,
wherein the reset signal corresponds to a reset level common to the plurality of image data signals and is stored by the sample readout circuit onto the reset-sampling capacitor after storing the plurality of image data signals onto the plurality of image storage capacitors, and
wherein there are fewer reset-sampling capacitors than image storage capacitors in each pixel block.

2. The image sensor of claim 1, wherein each of the plurality of image data signals are generated by each of respective photodiodes in each associated pixel block.

3. The image sensor of claim 1, wherein there are more image storage capacitors than photodiodes in each pixel block.

4. The image sensor of claim 1, wherein pixels of the pixel array are organized in pixel units comprising a photodiode and a selection transistor, the selection transistor coupling the photodiode to a first pixel node, the first pixel node coupled through a first source-follower transistor and a coupling capacitor to the image signal.

5. The image sensor of claim 4, wherein each pixel unit comprises a plurality of photodiodes coupled through selection transistors to the first pixel node.

6. The image sensor of claim 5, further comprising a signal cutoff transistor coupled between the selection transistors and the shutter transistors.

7. The image sensor of claim 1, wherein the image data signals from the image storage capacitors of each pixel block and the reset signal from the reset-sampling capacitor of each pixel block are configured to be read through a differential amplifier into an analog to digital converter, wherein the shutter transistors are formed in wells coupled to an analog power supply, and where a dark exposure level of the pixel corresponds to a voltage in the image storage capacitors near a voltage of the analog power supply, and a white exposure level of the pixel corresponds to a voltage in the image storage capacitors significantly different from the voltage of the power supply coupled to the well in which the shutter transistor is formed.

8. The image sensor of claim 7 wherein the shutter transistors are P-channel transistors in N-type wells coupled to the analog power supply.

9. The image sensor of claim 7 wherein the shutter transistors are N-channel transistors in grounded P-type wells.

10. An image sensor comprising:
an array of pixel blocks including one or more photodiodes, a plurality of image storage capacitors and a reset-sampling capacitor, each photodiode coupled to at least one shutter transistor, the at least one shutter transistor coupled to transfer an image data signal comprising a charge dependent on light exposure to a photodiode of the pixel block onto an associated image storage capacitor of the plurality of image storage capacitors associated with the pixel block, each pixel block including a sample readout circuit, configured to output the plurality of image data signals stored in the plurality of image storage capacitors, and a reset signal stored in the reset-sampling capacitor, each photodiode coupled to at least one selection transistor, the selection transistor coupling the photodiode to a first pixel node, the first pixel node coupled through a first source-follower transistor and a coupling capacitor to the image signal;
wherein the reset signal corresponds to a reset level common to the plurality of image data signals and is stored by the sample readout circuit onto the reset-sampling capacitor after storing the plurality of image data signals onto the plurality of image storage capacitors, and
wherein there are fewer reset-sampling capacitors than image storage capacitors in each pixel block;
wherein the selection transistor is configured to couple the photodiode to a first shutter transistor of the shutter transistors through the first pixel node and to transfer a first image data signal onto a first image storage capacitor of the plurality of image storage capacitors when a gate of the selection transistor is biased at a first selection voltage; wherein the selection transistor is configured to couple the photodiode to a second shutter transistor of the shutter transistors through the first pixel node and to transfer a second image data signal onto a second image storage capacitor of the plurality of image storage capacitors when the gate of the selection transistor is biased at a second selection voltage; wherein the first selection voltage is different from the second selection voltage.

11. A method of capturing a digital electronic image comprising:
resetting a plurality of photodiodes, and exposing the photodiodes to an optical image;
reading the plurality of photodiodes and storing charge dependent on photodiode exposure onto a plurality of image storage capacitors coupled to the plurality of photodiodes;
resetting the photodiodes and storing charges corresponding to a reset level on a reset-sampling capacitor after charge dependent on photodiode exposure has been stored onto the plurality of image storage capacitors; and
determining a plurality of image signals from a reset signal read from the reset-sampling capacitor and a plurality of image data signals read from the image storage capacitors, wherein the reset signal corresponding to the charges stored on the reset-sampling capacitor and each of the image data signals corresponding to charges stored on the associated image storage capacitor.

12. The method of claim 11, wherein determining a plurality of image signals comprises:
reading each of the plurality of image data signals separately, wherein each of the plurality of image data signals is read along with the reset signal; and
sensing difference between the reset signal and each of the plurality of image data signals to generate the plurality of image signals.

13. The method of claim 12, wherein sensing difference in charge between the reset capacitor and the image storage capacitor is performed through source follower transistors and a differential amplifier coupled into an analog to digital converter.

14. The method of claim 11, further comprising:
converting the sensed plurality of image signals into a digital image using an analog to digital converter.

15. The method of claim 11, wherein the charges stored onto each image storage capacitor are stored through nodes having all directly connected transistors with source and drain diffusion regions of a first conductive type formed in wells of a second conductive type, and the charge dependent on photodiode exposure provides a voltage on the image storage capacitor closer to a well voltage associated with the directly connected transistors for photodiodes exposed to dark portions of the optical image than for photodiodes exposed to light portions of the optical image.

16. The method of claim 15, wherein the first conductive type is a P-type and the second conductive type is an N-type.

17. The method of claim 15, wherein the first conductive type is an N-type and the second conductive type is a P-type.

18. The method of claim 11, wherein there is a plurality of image storage capacitors associated with each photodiode, and wherein reading the photodiodes and storing charge dependent on photodiode exposure onto the image storage capacitors comprises:
applying a first selection voltage to a gate of a photodiode selection transistor, storing charge on a first of the image storage capacitors;
applying a second selection voltage to the gate of the photodiode selection transistor different from the first selection voltage; and
storing charge on a second of the image storage capacitors.

* * * * *

UNITED STATES PATENT AND TRADEMARK OFFICE
CERTIFICATE OF CORRECTION

| | |
|---|---|
| PATENT NO. | : 11,095,842 B2 |
| APPLICATION NO. | : 16/523850 |
| DATED | : August 17, 2021 |
| INVENTOR(S) | : Mabuchi et al. |

It is certified that error appears in the above-identified patent and that said Letters Patent is hereby corrected as shown below:

In the Claims

Claim 4 at Column 14 Lines 43-44 "wherein pixels of the pixel array are organized" should read -- wherein pixels of the array of pixel blocks are organized --

Claim 13 at Column 16 Line 22 "between the reset capacitor" should read -- between the reset sampling capacitor --

Signed and Sealed this
Thirtieth Day of August, 2022

Katherine Kelly Vidal
*Director of the United States Patent and Trademark Office*